United States Patent
Marinov et al.

(10) Patent No.: US 12,266,558 B2
(45) Date of Patent: Apr. 1, 2025

(54) ADHESIVE TAPES FOR RECEIVING DISCRETE COMPONENTS

(71) Applicant: KULICKE & SOFFA NETHERLANDS B.V., Eindhoven (NL)

(72) Inventors: Val Marinov, Fargo, ND (US); Matthew R. Semler, Fargo, ND (US); Samuel Brown, West Fargo, ND (US)

(73) Assignee: Kulicke & Soffa Netherlands B.V., Eindhoven (NL)

( * ) Notice: Subject to any disclaimer, the term of this patent is extended or adjusted under 35 U.S.C. 154(b) by 298 days.

(21) Appl. No.: 17/783,987

(22) PCT Filed: Dec. 7, 2020

(86) PCT No.: PCT/US2020/063609
§ 371 (c)(1),
(2) Date: Jun. 9, 2022

(87) PCT Pub. No.: WO2021/126580
PCT Pub. Date: Jun. 24, 2021

(65) Prior Publication Data
US 2023/0017084 A1    Jan. 19, 2023

Related U.S. Application Data

(60) Provisional application No. 62/949,013, filed on Dec. 17, 2019.

(51) Int. Cl.
*H01L 21/683*    (2006.01)
*C09J 7/22*    (2018.01)
(Continued)

(52) U.S. Cl.
CPC ............ *H01L 21/6836* (2013.01); *C09J 7/22* (2018.01); *C09J 7/38* (2018.01); *C09J 7/403* (2018.01);
(Continued)

(58) Field of Classification Search
CPC ....... H01L 21/6836; H01L 2221/68363; H01L 2221/68368; H01L 2221/68381;
(Continued)

(56) References Cited

U.S. PATENT DOCUMENTS 6,204,350 B1 *   3/2001  Liu ........................ C08L 101/10
                                                            427/195
10,170,443 B1    1/2019  Horibe
(Continued)

FOREIGN PATENT DOCUMENTS

EP    0550014 A2 *   7/1993
EP    0622833 A1 *   2/1994
(Continued)

OTHER PUBLICATIONS

PCT International Preliminary Report on Patentability in International Appln. No. PCT/US2020/018262, dated Aug. 26, 2021, 20 pages.

(Continued)

*Primary Examiner* — Patricia L. Nordmeyer
(74) *Attorney, Agent, or Firm* — Christopher M. Spletzer, Sr.

(57) ABSTRACT

A system includes a vacuum chuck; and a tape. The tape includes a flexible polymer substrate; and an adhesive die catching film disposed on the flexible polymer substrate facing a front surface of the flexible polymer substrate. The tape is held on the vacuum chuck by suction applied to a rear surface of the flexible polymer substrate.

24 Claims, 6 Drawing Sheets

(51) Int. Cl.
*C09J 7/38* (2018.01)
*C09J 7/40* (2018.01)

(52) U.S. Cl.
CPC .... *C09J 2203/326* (2013.01); *C09J 2301/302* (2020.08); *C09J 2301/416* (2020.08); *H01L 2221/68363* (2013.01); *H01L 2221/68368* (2013.01); *H01L 2221/68381* (2013.01)

(58) Field of Classification Search
CPC ..... H01L 2221/68318; H01L 21/67132; H01L 21/6835; H01L 21/683; H01L 21/6838; C09J 7/22; C09J 7/38; C09J 7/403; C09J 2203/326; C09J 2301/302; C09J 2301/416
See application file for complete search history.

(56) References Cited

U.S. PATENT DOCUMENTS

| | | | |
|---|---|---|---|
| 10,217,637 | B1 | 2/2019 | Budd et al. |
| 10,381,255 | B2 | 8/2019 | Andry et al. |
| 10,529,614 | B2 | 1/2020 | Marinov |
| 10,748,802 | B2 | 8/2020 | Marinov et al. |
| 11,201,077 | B2 | 12/2021 | Marinov et al. |
| 2002/0076873 | A1 | 6/2002 | Spooner et al. |
| 2004/0048419 | A1 | 3/2004 | Kitamura et al. |
| 2004/0253768 | A1 | 12/2004 | Bosman et al. |
| 2005/0000638 | A1 | 1/2005 | Yamamoto |
| 2005/0003635 | A1 | 1/2005 | Takekoshi |
| 2007/0057410 | A1 | 3/2007 | Chan et al. |
| 2007/0081153 | A1 | 12/2007 | Hammond et al. |
| 2007/0281153 | A1* | 12/2007 | Yamamoto ............... C09J 7/38 428/355 R |
| 2010/0022053 | A1 | 1/2010 | Mund et al. |
| 2010/0190293 | A1 | 7/2010 | Maeda et al. |
| 2010/0294423 | A1 | 11/2010 | Takesue et al. |
| 2011/0048630 | A1 | 3/2011 | Hase et al. |
| 2011/0159223 | A1 | 6/2011 | Park et al. |
| 2012/0058289 | A1 | 3/2012 | Coates et al. |
| 2014/0138013 | A1 | 5/2014 | Attarawala et al. |
| 2014/0238592 | A1 | 8/2014 | Marinov et al. |
| 2015/0340265 | A1 | 11/2015 | Rudmann et al. |
| 2015/0357223 | A1 | 12/2015 | Takamoto et al. |
| 2016/0079109 | A1 | 3/2016 | Shima et al. |
| 2016/0133486 | A1 | 5/2016 | Andry et al. |
| 2017/0313044 | A1 | 11/2017 | Marinov et al. |
| 2017/0365499 | A1 | 12/2017 | Marinov |
| 2018/0218952 | A1 | 8/2018 | Horibe et al. |
| 2019/0057891 | A1 | 2/2019 | Marinov |
| 2019/0311926 | A1 | 10/2019 | Kim et al. |
| 2019/0348573 | A1 | 11/2019 | Raymond et al. |
| 2020/0023630 | A1 | 1/2020 | Sigl et al. |
| 2020/0075388 | A1 | 3/2020 | Yasuda et al. |
| 2020/0168498 | A1 | 5/2020 | Marinov et al. |
| 2020/0182923 | A1 | 6/2020 | Kobayashi et al. |
| 2020/0328143 | A1 | 10/2020 | Marinov |
| 2021/0375649 | A1 | 12/2021 | Marinov et al. |
| 2021/0375659 | A1 | 12/2021 | Marinov et al. |
| 2022/0093423 | A1 | 3/2022 | Colosimo et al. |
| 2022/0130694 | A1 | 4/2022 | Marinov et al. |

FOREIGN PATENT DOCUMENTS

| | | | |
|---|---|---|---|
| JP | 2009260226 | 11/2009 | |
| JP | 2017528006 | 9/2017 | |
| JP | 2019503081 | 1/2019 | |
| JP | 2019527465 | 9/2019 | |
| JP | 2018231042 A | 6/2020 | |
| TW | 201914825 | 4/2019 | |
| TW | 201940633 | 10/2019 | |
| WO | WO-9213363 A2 * | 8/1992 | ......... G02B 27/0093 |
| WO | WO 2013042981 | 3/2012 | |
| WO | 2012007585 | 9/2012 | |
| WO | WO 2012142177 | 10/2012 | |
| WO | WO2017123780 | 7/2017 | |
| WO | WO2018231344 | 12/2018 | |
| WO | WO 2019123901 | 6/2019 | |
| WO | WO-2020051410 A1 * | 3/2020 | ............. G06F 30/39 |
| WO | WO 2020252161 | 12/2020 | |
| WO | WO 2021126580 | 6/2021 | |

OTHER PUBLICATIONS

PCT International Preliminary Report on Patentability in International Appln. No. PCT/US2020/063609, dated Jun. 30, 2022, 14 pages.
PCT International Search Report and Written Opinion in International Appln. No. PCT/US2020/018262, dated Jun. 16, 2020, 25 pages.
PCT International Search Report and Written Opinion in International Appln. No. PCT/US2020/063609, dated Apr. 9, 2021, 19 pages.
Marinov et al., "Laser-assisted ultrathin die packaging: Insights from a process study," Microelectronic Engineering, 2013, 101:23-30.
Supplementary European Search Report in European Application No. EP 20 75 5894, dated Sep. 30, 2022, 8 pages.
Supplementary European Search Report in European Application No. EP 20902418.1, dated Apr. 26, 2024, 23 pages.
Supplementary European Search Report in European Application No. EP 20902418.1, dated Dec. 14, 2023, 20 pages.

* cited by examiner

ADHESIVE TAPES FOR RECEIVING DISCRETE COMPONENTS

CROSS-REFERENCE TO RELATED APPLICATIONS

This application is a U.S. National Phase application under 35 U.S.C. § 371 of International Patent Application of PCT/US2020/063609, filed on Dec. 7, 2020 which claims the benefit of priority to U.S. Application No. 62/949,013, filed on Dec. 17, 2019, the entire contents of which are hereby incorporated by reference.

BACKGROUND

This description relates generally to assembling discrete components onto a substrate.

SUMMARY

In an aspect, a system includes a vacuum chuck; and a tape. The tape includes a flexible polymer substrate; and an adhesive die catching film disposed on the flexible polymer substrate facing a front surface of the flexible polymer substrate. The tape is held on the vacuum chuck by suction applied to a rear surface of the flexible polymer substrate.

Embodiments can include one or any combination of two or more of the following features.

The system includes a discrete component support fixture disposed facing the side of the tape having the adhesive die catching film disposed thereon, with a gap defined between the tape and the discrete component support fixture. The system includes an optical system, in which the discrete component support fixture is disposed between the optical system and the tape. The optical system includes a light source and an optical element. The optical element includes a lens. The system includes a discrete component assembly disposed on the discrete component support fixture.

The system includes a discrete component partially embedded in or disposed on the coating.

The adhesive die catching film includes a viscoplastic adhesive material. The viscoplastic adhesive material includes a Bingham fluid.

The adhesive die catching film includes a photosensitizer.

The adhesive die catching film includes a chemical catalyst.

The adhesive die catching film includes a viscoelastic adhesive material. The viscoelastic adhesive material includes a pressure-sensitive adhesive.

The adhesive die catching film includes an adhesive elastic material.

The adhesive die catching film is configured to undergo a structural, phase, or chemical change responsive to irradiation of the material.

The tape includes a dynamic release structure disposed on the front surface of the flexible polymer substrate, and in which the adhesive die catching film is disposed on the dynamic release structure.

The system includes a dynamic release structure disposed on the rear surface of the flexible polymer substrate.

In an aspect, a method includes disposing a tape on a vacuum chuck, the tape including: a flexible polymer substrate; and an adhesive die catching film disposed on the flexible polymer substrate; and applying suction to the tape to hold the tape on the vacuum chuck.

Embodiments can include one or any combination of two or more of the following features.

The method includes receiving a discrete component into or onto the adhesive die catching film.

The method includes providing the tape with the discrete component disposed in or on the adhesive die catching film to a die placement system. The die placement system includes one or more of a die bonding system, a die sorting system, a die mixing system, or a die re-pitching system.

The method includes releasing the discrete component from the adhesive die catching film by a laser-assisted transfer process. The tape includes a dynamic release structure disposed on the flexible polymer substrate, the adhesive die catching film is disposed on the dynamic release structure, and releasing the discrete component from the adhesive die catching film by a laser-assisted transfer process includes irradiating the dynamic release structure of the tape through the flexible polymer substrate to cause release of the discrete component. The adhesive die catching film is configured to release the discrete component responsive to irradiation of the material, and releasing the discrete component from the adhesive die catching film by a laser-assisted transfer process includes irradiating the adhesive die catching film through the flexible polymer substrate to cause release of the discrete component. The adhesive die catching film is disposed on a first side of the flexible polymer substrate, and the tape includes a dynamic release structure disposed on a second side of the flexible polymer substrate; and releasing the discrete component from the adhesive die catching film by a laser-assisted transfer process includes irradiating the dynamic release structure through the flexible polymer substrate to cause release of the discrete component. The method includes adhering the dynamic release structure to a rigid support; and irradiating the dynamic release structure through the rigid support to cause release of the discrete component.

The method includes, while the discrete component is disposed in or on the adhesive die catching film, interconnecting the discrete component to a substrate. The method includes interconnecting the discrete component to the substrate in a die stamping system.

The method includes transferring the discrete component from the adhesive die catching film to a second substrate; and providing the second substrate including the discrete component to a die placement system. The die placement system includes one or more of a die bonding system, a die sorting system, a die mixing system, or a die re-pitching system.

The method includes transferring the discrete component from the adhesive die catching film to a second substrate; and providing the second substrate including the discrete component to a die stamping system to interconnect the discrete component to a device substrate.

The adhesive die catching film includes a photosensitizer; and the method includes illuminating the adhesive die catching film with UV light to cross-link the photosensitive polymer after receiving the discrete component.

The adhesive die catching film includes a chemical catalyst; and the method includes crosslinking the adhesive die catching film by action of the chemical catalyst after receiving the discrete component.

The method includes exposing the adhesive die catching film to heat to solidify the adhesive die catching film after receiving the discrete component.

The method includes drying the adhesive die catching film after receiving the discrete component to solidify the adhesive die catching film.

The method includes irradiating a discrete component assembly, in which the irradiating causes a discrete component to be released from the discrete component assembly; and receiving the released discrete component into or onto the adhesive die catching film. The discrete component assembly includes a dynamic release structure disposed on a carrier, and in which the discrete component is disposed on the dynamic release structure; and in which irradiating the discrete component assembly includes irradiating the dynamic release structure. Irradiating the dynamic release structure includes inducing ablation of at least a portion of the dynamic release structure. Irradiating the dynamic release structure includes inducing a change in a surface morphology of the dynamic release structure. Irradiating the dynamic release structure includes inducing blistering of a surface of the dynamic release structure.

The method includes removing a protective film from the adhesive die catching film prior to receiving the discrete component.

The method includes removing the received discrete component from the adhesive die catching film; and reusing the tape to receive a second discrete component into or onto the adhesive die catching film. The adhesive die catching film includes an elastic adhesive material.

In an aspect, a tape for receiving a discrete component includes a flexible polymer substrate; an adhesive die catching film disposed on the flexible polymer substrate, in which the adhesive die catching film includes one or more of a viscoelastic adhesive material, a viscoplastic adhesive material, or an elastic adhesive material; and a protective film disposed on the adhesive die catching film.

Embodiments can include one or any combination of two or more of the following features.

The adhesive die catching film includes a pressure-sensitive adhesive.

The adhesive die catching film includes a Bingham fluid.

The adhesive die catching film includes a crosslinking promoter.

The crosslinking promoter includes a photosensitive polymer.

The crosslinking promoter includes a chemical catalyst.

The adhesive die catching film is disposed on a front surface of the flexible polymer substrate, and a rear surface of the flexible polymer substrate includes an adhesive material. The tape includes a rigid substrate, and the flexible polymer substrate is adhered to the rigid substrate by the flexible polymer substrate.

The flexible polymer substrate is held onto a vacuum chuck by suction.

The tape includes a dynamic release structure disposed on the flexible polymer substrate, and in which the adhesive die catching film is disposed on the dynamic release structure.

The adhesive die catching film is configured to release the discrete component responsive to irradiation of the material.

The adhesive die catching film is disposed on a first surface of the flexible polymer substrate, and the tape includes a dynamic release structure disposed on a second surface of the flexible polymer substrate.

The flexible polymer substrate is removable from the adhesive die catching film.

The protective film is removable from the adhesive die catching film.

In an aspect, a method includes forming an adhesive die catching film on a flexible polymer substrate facing a front surface of the flexible polymer substrate, the adhesive die catching film including one or more of a viscoelastic adhesive material, a viscoplastic adhesive material, or an elastic adhesive material; and disposing a protective film over the adhesive die catching film.

Embodiments can include one or any combination of two or more of the following features.

The method includes forming the adhesive die catching film of a pressure sensitive adhesive.

The method includes forming the adhesive die catching film of a Bingham fluid.

The method includes forming the adhesive die catching film of an ultraviolet sensitive polymer and a crosslinker.

Forming the adhesive die catching film includes forming the adhesive die catching film by a direct coating technique.

Forming the adhesive die catching film includes forming the adhesive die catching film by a transfer coating technique.

The method includes disposing a dynamic release structure on the front surface of the flexible polymer substrate; and forming the adhesive die catching film on the dynamic release structure.

The method includes forming the adhesive die catching film such that the adhesive die catching film is configured to release a discrete component from the adhesive die catching film responsive to irradiation of the adhesive die catching film.

The method includes disposing a dynamic release structure on a rear surface of the flexible polymer substrate.

The method includes applying, by a vacuum chuck, a suction to a rear surface of the flexible polymer substrate to hold the flexible polymer substrate on the vacuum chuck.

The method includes adhering a rear surface of the flexible polymer substrate to a rigid substrate.

The method includes removing the flexible polymer substrate from the adhesive die catching film to expose a rear surface of the die catching film. The method includes adhering the rear surface of the die catching film to a rigid substrate.

In an aspect, a method includes removing a rear protective layer from an adhesive die catching film to expose a rear surface of the adhesive die catching film, in which the adhesive die catching film forms part of a die catching tape including the rear protective layer, the adhesive die catching film disposed on the rear protective layer, and a front protective layer disposed on a front surface of the adhesive die catching film, in which the adhesive die catching film includes one or more of a viscoelastic adhesive material, a viscoplastic adhesive material, or an elastic adhesive material; adhering the rear surface of the adhesive die catching film to a substrate; removing the front protective layer from the adhesive die catching film to expose the front surface of the adhesive die catching film; and receiving a discrete component onto the front surface of the adhesive die catching film, the discrete component having been transferred in a laser-assisted transfer process.

Embodiments can include one or any combination of two or more of the following features.

The adhesive die catching film includes a photosensitizer, and the method including illuminating the adhesive die catching film with UV light after receiving the discrete component to cross-link the photosensitive polymer.

The adhesive die catching film includes a chemical catalyst, and the method includes crosslinking the adhesive die catching film by action of the chemical catalyst after receiving the discrete component.

The method includes exposing the adhesive die catching film to heat to solidify the adhesive die catching film after receiving the discrete component.

The method includes drying the adhesive die catching film after receiving the discrete component to solidify the adhesive die catching film.

The method includes removing the received discrete component from the front surface of the adhesive die catching film; and reusing the adhesive die catching film to receive a second discrete component onto the front surface of the adhesive die catching film.

In an aspect, a tape for receiving a discrete component includes a flexible polymer substrate; and a film disposed on the flexible polymer substrate, in which the film includes one or more of a viscoelastic adhesive material, a viscoplastic adhesive material, or an elastic adhesive material, and in which the film is configured to undergo a structural, phase, or chemical change responsive to irradiation of the film.

Embodiments can include one or any combination of two or more of the following features.

The film is configured to form a blister responsive to absorption of incident radiation.

In an aspect, a tape for receiving a discrete component includes a flexible polymer substrate; a dynamic release structure disposed on the flexible polymer substrate; and an adhesive die catching film disposed on the dynamic release structure.

Embodiments can include one or any combination of two or more of the following features.

The adhesive die catching film includes one or more of a viscoelastic adhesive material, a viscoplastic adhesive material, or an elastic adhesive material.

The dynamic release structure is configured to undergo a structural, phase, or chemical change responsive to irradiation of the dynamic release structure. The film is configured to form a blister responsive to absorbing incident radiation.

In an aspect, a tape for receiving a discrete component includes a flexible polymer substrate; an adhesive die catching film disposed on a first surface of the flexible polymer substrate; and a dynamic release structure disposed on a second surface of the flexible polymer substrate.

Embodiments can include one or any combination of two or more of the following features.

The adhesive die catching film includes one or more of a viscoelastic adhesive material, a viscoplastic adhesive material, or an elastic adhesive material.

The dynamic release structure is configured to undergo a structural, phase, or chemical change responsive to irradiation of the dynamic release structure. The film is configured to form a blister responsive to absorbing incident radiation.

The details of one or more implementations are set forth in the accompanying drawings and the description below. Other features and advantages will be apparent from the description and drawings, and from the claims.

DETAILED DESCRIPTION

We describe here tapes for receiving discrete components, such as light emitting diodes (LEDs), transferred onto the tapes by a laser-assisted transfer process. The tapes include an adhesive die catching film that can include a viscoelastic adhesive material, a viscoplastic adhesive material, or an elastic adhesive material.

In general, discrete components transferred via laser-assisted transfer processes travel at high speed vertically (e.g., downwards) across a gap between a support and a target substrate. Due to materials imperfections, imperfections in the transfer process, or both, the direction of travel of the discrete component in a laser-assisted transfer process can sometimes have a lateral (e.g., horizontal) component. This lateral component to the direction of travel of the discrete component can cause the discrete component to move laterally once it hits the target substrate, e.g., by skidding or sliding; to bounce off the substrate; to rotate such that the discrete component no longer lies flat on the tape (sometimes referred to as "tombstoning"), or a combination of two or more of these effects. Moreover, even when the direction of travel of a discrete component is entirely vertical, the discrete component can still be susceptible to one or more of these effects because of surface imperfections or surface hardness of the target substrate. These effects can have adverse effects on the accuracy of placement of discrete components on the target substrate, the yield of the laser-assisted transfer process, or both.

The use of a tapes including adhesive die catching films can help to reduce the occurrence of these adverse effects, e.g., to reduce spontaneous shifting of the position of the transferred discrete component, bouncing of the discrete component off of the surface of a tape upon arrival onto the tape, or "tombstoning" of the discrete component. As a result, high precision placement of discrete components onto the tapes can be achieved. In addition, the use of tapes as receiving substrates for laser-assisted transfer of discrete components, in comparison to gel-coated substrates, for example, can improve the efficiency of the laser-assisted transfer processes, because the tapes can be disposable and thereby eliminate the need for substrate cleaning and reconfiguration for repeated receipt of transferred discrete components.

Figure 1:
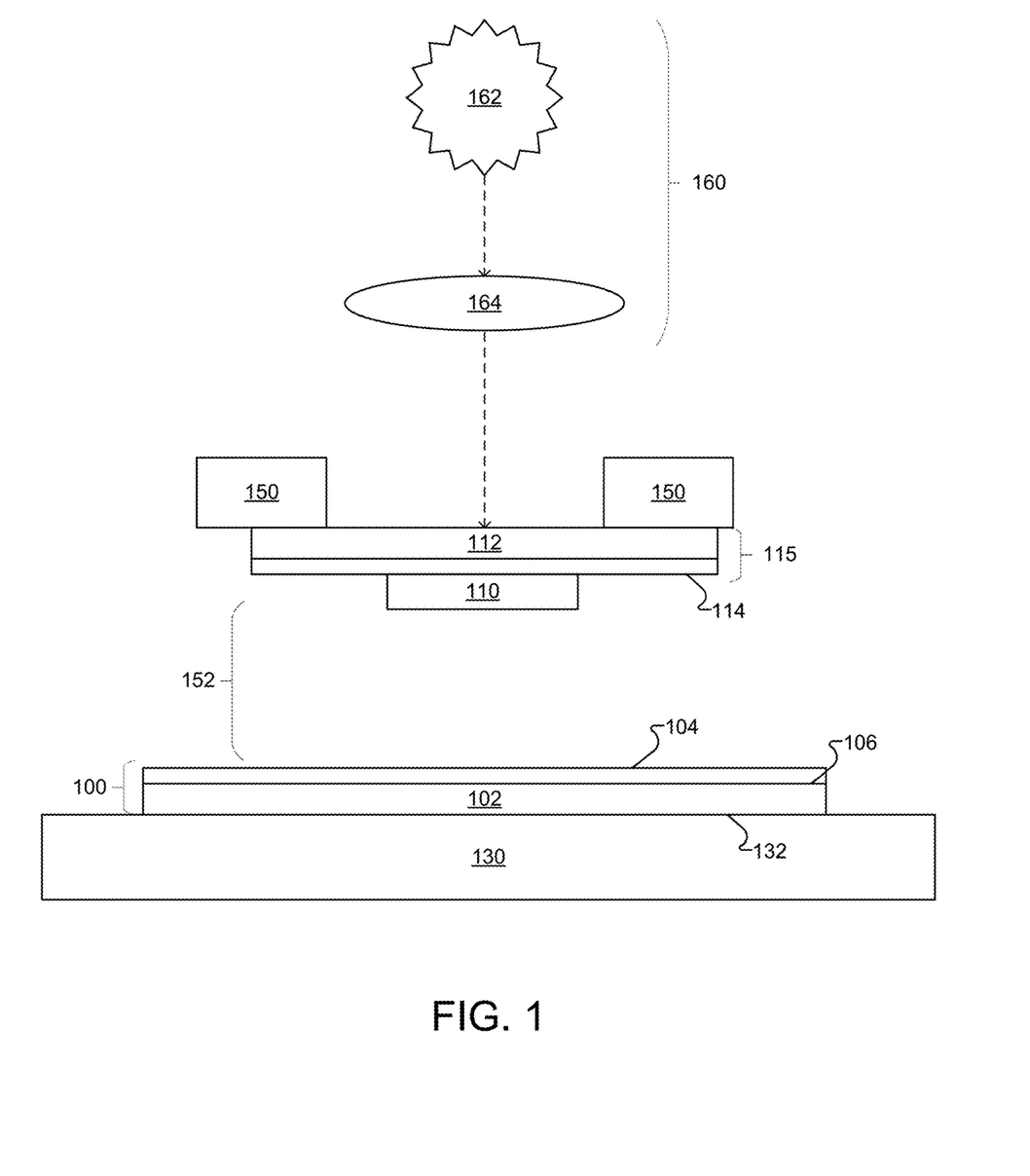
FIG. 1 is a diagram of a laser-assisted transfer system.

Referring to FIG. 1, a tape 100 includes a flexible polymer substrate 102 with an adhesive die catching film 104 (discussed further below) disposed on a front surface 106 of the substrate 102. A tape in the context of this description refers generally to a multilayer structure, such as a multilayer structure that has sufficient mechanical strength to be a freestanding element. A film in the context of this description refers generally to a single layer, such as a layer of a tape. The flexible polymer substrate 102 provides mechanical support enabling the tape 100 to be a freestanding, flexible element.

The tape 100 can be intended for use as a target substrate for receiving a discrete component 110 transferred via a laser-assisted transfer process. The term discrete component refers generally to, for example, any unit that is to become part of a product or electronic device, for example, electronic, electromechanical, photovoltaic, photonic, or optoelectronic components, modules, or systems, for example any semiconductor material having a circuit formed on a portion of the semiconducting material. In some examples, the discrete components can be light emitting diodes (LEDs). The discrete components can be ultra-thin, meaning having a maximum thickness of 50 μm or less, 40 μm or less, 30 μm or less, 25 μm or less, 20 μm or less, 10 μm or less, or 5 μm or less. The discrete components can be ultra-small, meaning having a maximum length or width dimension less than or equal to 300 μm per side, 100 μm per side, 50 μm per side, 20 μm per side, or 5 μm per side. The discrete components can be both ultra-thin and ultra-small.

In the laser-assisted transfer process, the discrete component 110 is adhered to a support 112 by a dynamic release structure 114, forming a discrete component assembly 115. A back side of the support 112 is irradiated with radiation, such as laser light, causing a change in the dynamic release structure (discussed in more detail below) that releases the discrete component 110 from the support 112. The discrete component 110 is propelled away from the support 112 (e.g., in a downward direction) and lands on the adhesive die catching film 104 of the tape 100. The adhesive die catching film 104 receives the discrete component 110 and keeps it in its targeted position while reducing post-transfer movement of the discrete component 110 on the tape 100, bouncing of the discrete component 110 off of the tape 100, tombstoning of the discrete component, or a combination of any two or more of them.

The adhesive die catching film 104 is composed of a die catching material, which is a material that has an adhesive property that enables the adhesive die catching film 104 to receive an incident discrete component, retain the discrete component substantially in the same position once the discrete component is received, and cause the discrete component to lie flat on the tape, e.g., preventing shifting, bouncing, or tombstoning of the discrete component. For instance, the die catching material can be a viscoelastic adhesive material, a viscoplastic adhesive material, or an elastic adhesive material.

In some examples, the adhesive die catching film 104 includes a viscoelastic adhesive die catching material. A viscoelastic material is a viscous material that exhibits elasticity responsive to an applied force. Viscoelastic materials are generally hard (e.g., harder than viscoplastic materials), such that discrete components transferred onto a viscoelastic material may bounce. The adhesive properties of the viscoelastic materials used in the adhesive die catching film 104 can help prevent such bouncing. Viscoelastic materials can have the advantage that when transferred discrete components are removed from a viscoelastic adhesive die catching film, the viscoelastic adhesive material remains on the tape and does not transfer to the removed discrete component, such that cleaning the discrete component to remove the adhesive may not be necessary.

In a specific example, the adhesive die catching film 104 includes a viscoelastic adhesive die catching material such as a pressure sensitive adhesive. For instance, when the viscoelastic adhesive die catching material is a pressure sensitive adhesive, when the discrete component 110 lands on the adhesive die catching film 104, the discrete component 110 exerts a force on the pressure sensitive adhesive 104, activating the pressure sensitive adhesive to adhere to the discrete component 110. As a result, post-transfer bouncing and movement of the discrete component 110 is limited.

In some examples, the adhesive die catching film 104 includes a viscoplastic adhesive die catching material having a yield stress, such as a Bingham plastic or pseudoplastic material. A viscoplastic material is a viscous material that exhibits plastic deformation when the applied force exceeds its yield stress. Examples of viscoplastic materials include tacky fluxes and gels (e.g., alcogels, hydrogels, organogels, or other types of gels).

In some examples, the adhesive die catching film includes a material (e.g., a viscoelastic or a viscoplastic adhesive material) that solidifies after receiving a transferred discrete component so as to hold the discrete component in position, e.g., by crosslinking or drying. For instance, the adhesive die catching film can include a viscoelastic or viscoplastic adhesive die catching material that includes a crosslinking promoter, such as a photosensitive polymer (e.g., an ultraviolet (UV) photosensitizer) or a chemical catalyst that promotes crosslinking, which initiates the photopolymerization, or cross-linking, reaction. After the discrete component has been transferred onto the adhesive die catching film, the die catching material can be converted into solid material by activation of the crosslinking promoter, e.g., by application of light (e.g., UV light) that by chemical exposure (e.g., by exposure to the chemical catalyst), or in another way. In some examples, the die catching film can be crosslinked by heat curing. In some examples, the adhesive die catching film can include a material that dries, e.g., solidifies by evaporation.

In some examples, the adhesive die catching film 104 includes an elastic adhesive material, such as a solid, elastic material with high tack and sufficiently elasticity to absorb the impact of the discrete component, e.g., preventing the discrete component 110 from bouncing. An elastic material is a material that deforms elastically responsive to an applied force. Examples of elastic adhesive materials include silicone-based polymers such as polydimethylsiloxane (PDMS). An elastic adhesive die catching material reacts elastically when receiving the discrete component 110, meaning that there is little to no structural change (e.g., structural damage) to the adhesive die catching film 104. An adhesive die catching film 104 including an elastic adhesive material can be reused for multiple laser transfer processes because of the minimal structural change that occurs in the adhesive die catching film 104 upon receipt of a discrete component 110. For instance, a tape 100 (or other substrate, such as a rigid substrate) having an adhesive die catching film 104 including an elastic adhesive material can be a reusable component in the laser transfer process, improving efficiency of the process by eliminating the step of preparing a receiving substrate having an adhesive die catching film 104 disposed thereon for each laser transfer.

Figure 2:
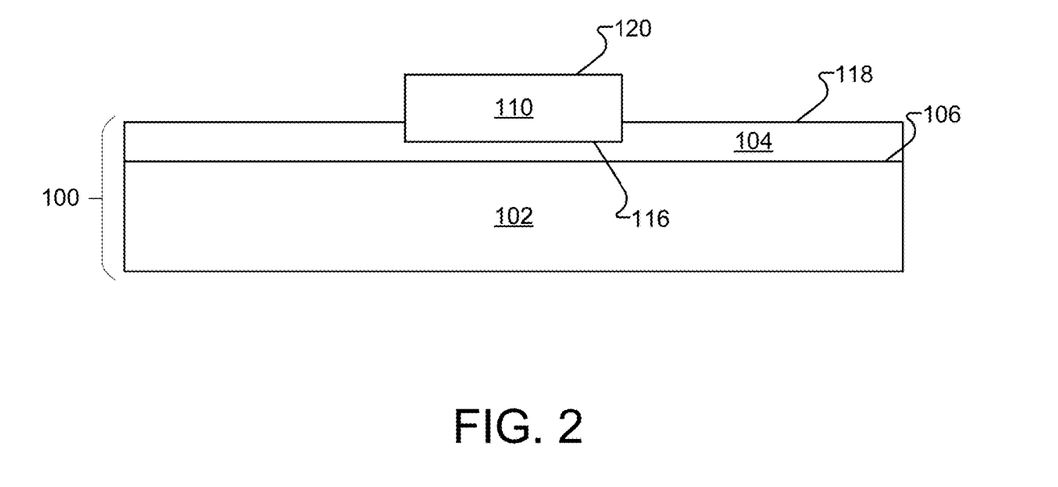
FIGS. 2-5 are diagrams of tapes for receiving transferred discrete components.

Referring to FIG. 2, in examples in which the adhesive die catching film 104 includes a viscoplastic adhesive die catching material, such as a Bingham fluid, when the discrete component 110 is transferred to the tape 100, the discrete component 110 is caught by the adhesive die catching film 104 including the viscoplastic adhesive material and is partially embedded into the coating (as shown in FIG. 2) or disposed on top of the coating. By partially embedded, we mean that a bottom surface 116 of the discrete component 110 is below a top surface 118 of the adhesive die catching film 104, while a top surface 120 of the discrete component 110 is above the top surface 118 of the adhesive die catching film 104. Once the discrete component 110 is partially embedded in or disposed on the adhesive die catching film 104, the rheological characteristics of the viscoplastic adhesive material (e.g., the Bingham fluid) prevent the discrete component 110 from spontaneously shifting its position or floating. The component placement precision and accuracy can thus be enhanced through the use of an adhesive die catching film including a viscoplastic adhesive material, such as a Bingham fluid.

Referring again to FIG. 1, in the laser-assisted transfer process, the discrete component assembly 115 is disposed on a discrete component support fixture 150. The discrete component support fixture 150 is positioned facing the side of the tape 100 on which the adhesive coating 104 is disposed, and is separated from the tape 100 by a gap 152. The discrete component assembly 115 includes the discrete component 110 adhered to the support 112, which can be a rigid support, such as a glass or rigid polymer substrate; or a flexible support, such as a tape. The discrete component 110 is adhered to the support 112 by the dynamic release structure 114, which can be a single layer structure or a multi-layer structure. A dynamic release structure is formed of a material that undergoes a chemical, phase, or structural change when irradiated with light, such as ultraviolet light. For instance, a dynamic release structure can be made of a material that absorbs the incident light, thereby generating gas that expands, forming a blister within the material. The discrete component support fixture 150 is an element that is configured to hold the support 112 in position for laser-assisted transfer. For instance, when the support 112 is a flexible support such as a tape, the discrete component support fixture 150 can include a support plate positioned on a support frame, with the support 112 being held against the support plate by application of a suction. When the support 112 is a rigid support, the discrete component support fixture can include slots, clamps, adhesives, or other support elements for holding the support 112 in place.

The discrete component support fixture 150 is disposed between the tape 100 and an optical system 160. The optical system 160 includes a light source 162, such as a laser, and one or more optical elements 164, such as lenses or diffractive optical elements (e.g., beam splitters). Light from the light source 162 is incident on the one or more optical elements 164, which direct the light onto the back side of the support 112. The support 112 is transparent to the wavelength of the incident light from the light source 162, meaning that at least some radiation of the given wavelength passes through the support 112. The radiation passes through the support 112 and is incident on an area of the dynamic release structure 114.

The incident light causes a structural, phase, or chemical change in at least a partial thickness of the dynamic release structure 114 in the area on which the radiation is incident, resulting in release of the discrete component 110 from the support 112. In some examples, the incident light can cause ablation of at least a partial thickness of the dynamic release structure 114 in the area on which the radiation is incident. The ablation generates confined gas, which expands, generating a stress in the dynamic release structure 114. The stress causes at least some of the material of the dynamic release structure 114 to deform, forming one or more blisters that exert a mechanical force on the discrete component 110. When the mechanical force exerted by the blister is sufficient to overcome the adhesion between the discrete component 110 and the dynamic release structure 114, the mechanical force exerted by the blister (in combination with gravity) propels the discrete component 110 away from the support 112 (e.g., in a downward direction) for transfer to the tape 100. In some examples, the incident light can cause a change in a morphology, such as a surface morphology, of the dynamic release structure 114. For instance, the change in surface morphology can include formation of blisters on the surface of the dynamic release structure. In some examples, the incident light can induce a phase transition, e.g., melting or sublimation, in at least a partial thickness of the dynamic release structure 114. In some examples, the incident light can induce a chemical change, such as thermal decomposition or photodegradation, of at least a partial thickness of the dynamic release structure 114. In some examples, the structural, phase, or chemical change in at least a partial thickness of the dynamic release structure 114 can be induced at least partially by heat, e.g., by a combination of light and heat.

Further description of laser-assisted transfer processes can be found in U.S. Patent Publication No. US 2014/0238592, the contents of which are incorporated here by reference in their entirety.

During the laser-assisted transfer process, the tape 100 can be disposed on a vacuum chuck 130 such that discrete components 110 are transferred onto the tape 100 held on the vacuum chuck 130. For instance, the tape 100 can be held in place on the vacuum chuck 130 by suction applied to a rear surface 132 of the flexible polymer substrate 102.

The tape 100, with one or more discrete components 110 attached thereto, can be used as a source tape for transferring the discrete components 110 to another substrate. In an example, the tape 100 with attached discrete components 110 can be provided to a die placement system, such as a die bonding, die mixing, die sorting, or die re-pitching system, for transfer of the discrete components from the tape 100 onto one or more other substrates. By die re-pitching, we mean placing discrete components onto a target substrate such that the pitch of the discrete components is different than the pitch of the discrete components on their source substrate. In another example, the tape 100 with attached discrete components 110 can be used as a stamp in a die stamping process, in which the tape 100 with attached discrete components 110 is pressed against a receiving substrate, such as a printed circuit board, and the discrete components 110 are interconnected to the receiving substrate. In another example, the tape 100 can serve as an intermediate carrier substrate from which the discrete components 110 are transferred (e.g., by a pick-and-place process) from the tape 100 to a second flexible or rigid carrier substrate. Once the discrete components 110 are on the second carrier substrate, the second carrier substrate can be provided to a die placement system, such as a die bonding, die mixing, die sorting, or die re-pitching system, or can be used as a stamp in a die stamping process, for transfer of the discrete components onto a target substrate. The compatibility of the tape 100 with downstream processing operations such as die placement operations, e.g., die bonding, die mixing, die sorting, or die re-pitching, facilitates the performance of such operations easily, quickly, and inexpensively following laser-assisted transfer of discrete components onto the tape 100.

Figure 3:
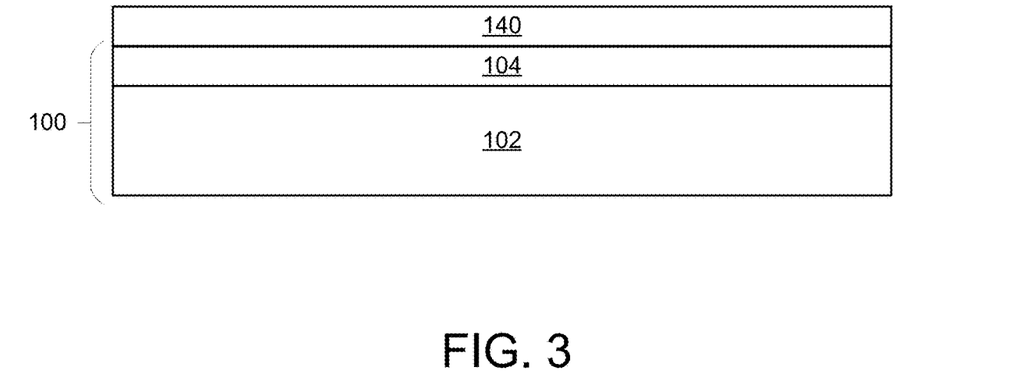

Referring to FIG. 3, to make the tape 100, the adhesive die catching film 104 is formed on a front surface of the flexible polymer substrate 102. In some examples, the die catching material 104 is formed by direct coating, in which the die catching material is coated directly onto the flexible polymer substrate 102 to form the die catching film 104. In some examples, the die catching material is formed by transfer coating, in which the die catching material is first coated onto a release-coated liner and then transferred, e.g., by lamination, to the flexible polymer substrate to form the adhesive die catching film 104. The materials properties and thickness of the adhesive die catching film 104 can be controlled during fabrication of the tape, enabling the properties and thickness to be tailored for specific applications (e.g., specific discrete component geometries) and providing for high precision, accuracy, and yield of laser-assisted transfer of discrete components onto the tape.

A protective film 140 is disposed over the adhesive die catching film 104 to prevent the adhesive die catching film 104 from inadvertently adhering to other objects prior to receiving a discrete component, to prevent the die catching material from contamination or environmentally-induced material degradation, or both. The protective film 140 can be removed from the adhesive die catching film 104 while leaving the adhesive die catching film intact. The protective film 140 can be a free-standing flexible film, such as a release-coated liner. In some examples, the protective film can be formed of a polymer with low interfacial adhesion and non-stick properties, such as a thermoplastic polymer such as polytetrafluoroethylene or similar fluoropolymers, polyethylene, polyvinylchloride, polypropylene, or other suitable polymers. In some examples, the protective film can be a polymer that is provided with non-stick and low adhesion properties by a treatment, such as by coating the protective film with a non-stick release agent. The protective film can have properties such as low permeability, moisture protection properties, ultraviolet (UV) light protection properties, or other properties that can help prevent the degradation of the underlying die catching material that can result, for instance, from exposure to the environment. The protective film 140 is removed prior to the laser-assisted transfer process, such as prior to placing the tape 100 on a vacuum chuck.

Figure 4:
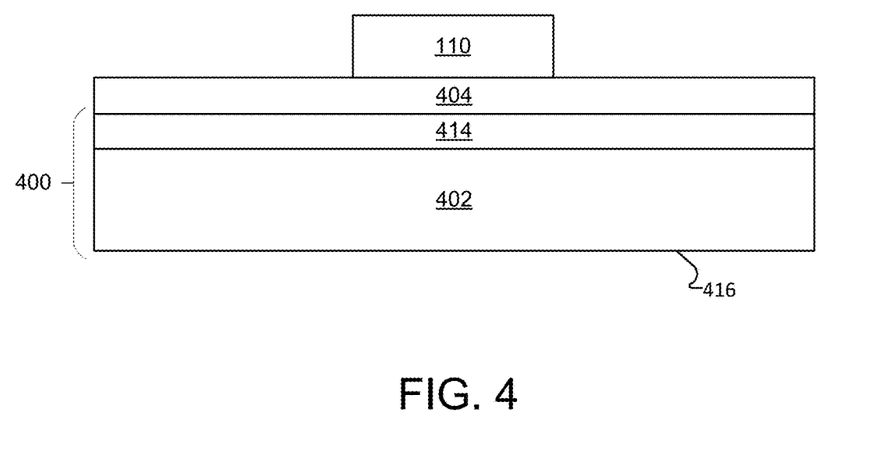

FIG. 4 shows an example of a tape 400 for receiving discrete components in a laser-assisted transfer process. The tape 400 includes a dynamic release structure 414 disposed between a flexible polymer substrate 402 and an adhesive die catching film 404. The dynamic release structure 414 can be a single-layer dynamic release structure or a multi-layer dynamic release structure. The tape 400 can act as a substrate for receiving discrete components 110 transferred in a laser-assisted transfer process, as described above. The tape 400 with attached discrete components then can be used as a source tape in a subsequent laser-assisted transfer process to transfer the discrete components 110 to another substrate. For instance, the tape 400 can be mounted in a discrete component support fixture and an optical system can be used to illuminate a rear surface 416 of the flexible polymer substrate 402. The flexible polymer substrate 402 is transparent to the wavelength of the incident light such that the light passes through the flexible polymer substrate and is incident on an area of the dynamic release structure 414. The light incident on the dynamic release structure 414 causes a structural, phase, or chemical change, such as ablation, phase change, or morphological change, of at least a partial thickness of the dynamic release structure 414, causing a discrete component 110 to be released from the tape. A protective film (not shown) can be disposed over the adhesive die catching film 404 prior to the use of the tape 400 to receive discrete components. The integration of the dynamic release structure 414 into the tape 400 makes the tape 400 versatile, for instance, enabling subsequent laser transfer operations to be carried out easily, quickly, and inexpensively.

Figure 5:
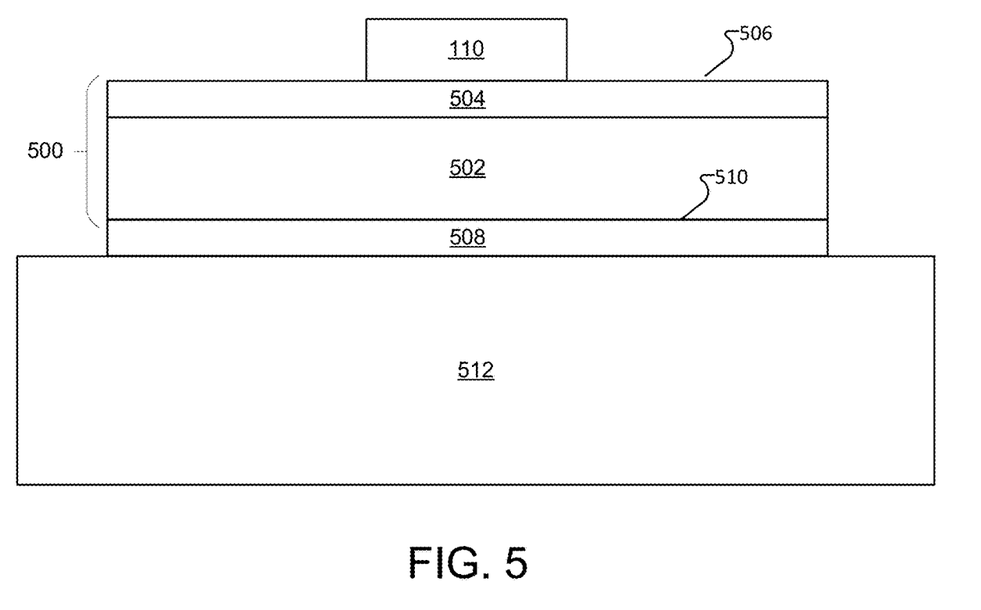

FIG. 5 shows an example of a tape 500 for receiving discrete components in a laser-assisted transfer process. The tape 500 includes a flexible polymer substrate 502 and an adhesive die catching film 504 on a front surface 506 of the tape, the adhesive die catching film 504 including a viscoelastic or viscoplastic adhesive material or an elastic adhesive material. An adhesive layer 508 is disposed on a rear surface 510 of the flexible polymer substrate 502. For the laser-assisted transfer process of a discrete component 110 onto the tape 500, the tape 500 is adhered to a substrate 512, such as a rigid substrate (e.g., a glass, silicon, metal, ceramic, or rigid polymer substrate), by the adhesive layer 508 on the rear surface 510 of the flexible polymer substrate 502. Prior to adhering the tape 500 to the rigid substrate 512, a protective film (not shown), such as a removable release liner, can be disposed over the rear adhesive layer 508 to protect the adhesive layer, e.g., preventing the adhesive layer from adhering to objects or preventing the adhesive layer from exposure to the environment.

Figure 6A:
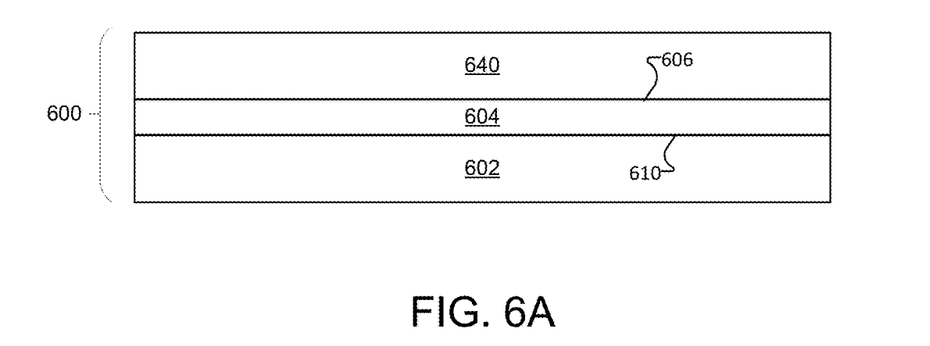
FIGS. 6A-6C are diagrams of a die catching film for receiving transferred discrete components.

FIG. 6A shows an example of a tape 600 for receiving discrete components in a laser-assisted transfer process. The tape 600 includes an adhesive die catching film 604 including a viscoelastic or viscoplastic elastic material or an elastic adhesive material. A front protective film 640 is disposed on a front surface 606 of the adhesive die catching film 604. A flexible polymer substrate 602 forms a rear protective film disposed on a rear surface 610 of the adhesive die catching film 604. The protective film 640 and the flexible polymer substrate 602 are each a free-standing flexible film, such as a release-coated liner, that has low interfacial adhesion and non-stick properties. The protective film 640 and the flexible polymer substrate 602 can have properties such as low permeability, moisture protection properties, ultraviolet (UV) light protection properties, or other properties that can help prevent the degradation of the adhesive die catching film 604 that can result, for instance, from exposure to the environment. The tape 600, including the adhesive die catching film 604, the protective film 640, and the flexible polymer substrate 602, is a free-standing tape.

Figure 6B:
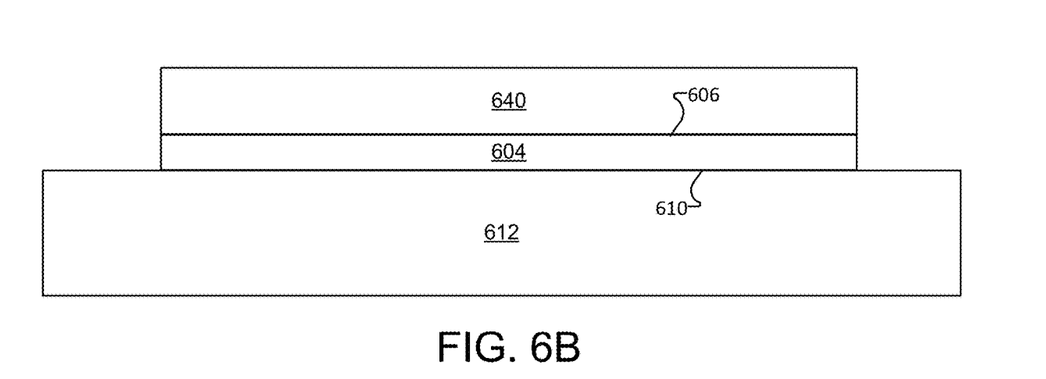

Referring to FIG. 6B, to use the tape 600 to receive a discrete component 110 in a laser-assisted transfer process, the protective film that is the flexible polymer substrate 602 is removed from the adhesive die catching film 604, leaving the adhesive die catching film 604 intact and exposing the rear surface 610 of the adhesive die catching film 604. Because the adhesive die catching film 604 is formed of an adhesive material, such as an elastic, viscoelastic, or viscoplastic adhesive material, the rear surface 610 of the die catching film 604 is adhesive. The adhesive die catching film 604 is adhered to a substrate 612, such as a rigid substrate, by contacting the rear surface 610 of the adhesive die catching film 604 to the substrate 612.

Figure 6C:
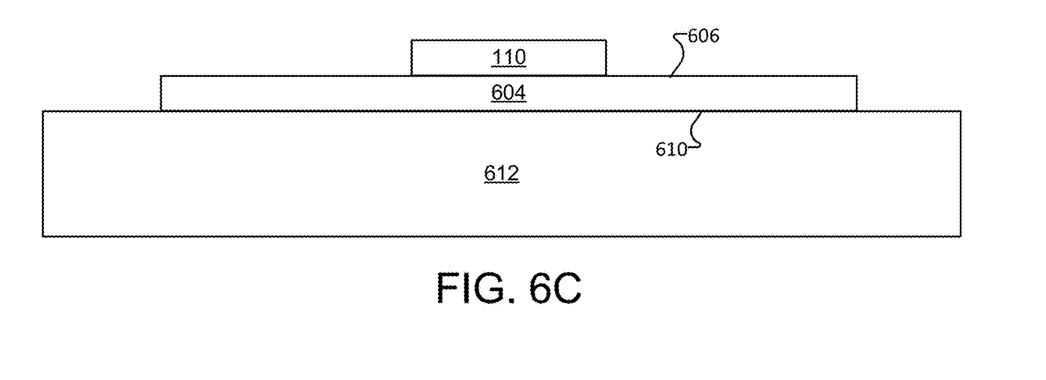

Referring to FIG. 6C, the front protective film 640 then can be removed, leaving the adhesive die catching film 604 intact and exposing the front surface 606 of the adhesive die catching film 604. When the discrete component 110 is transferred by a laser-assisted transfer process, the discrete component is received onto the front surface 606 of the adhesive die catching film 604, which is disposed directly on the substrate 612.

Figure 7:
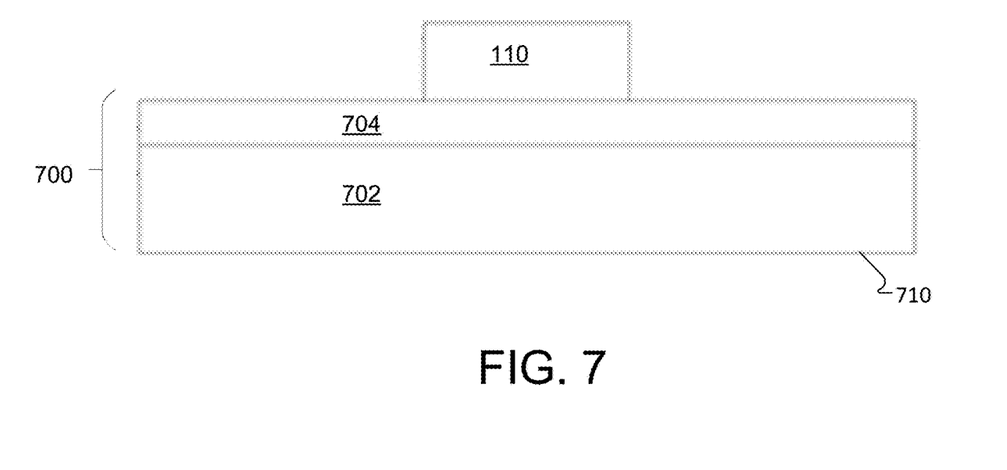
FIG. 7 is a diagram of a tape for receiving transferred discrete components.

FIG. 7 shows an example of a free-standing tape 700. The tape 700 includes a flexible polymer substrate 702 with a film 704 disposed on the substrate 702. The film 704 can be a single layer structure or a multilayer structure. The film 704 serves as both an adhesive die catching film and as a dynamic release structure. For instance, the film 704 can be a single layer of material with uniform composition, that has the properties of an adhesive die catching film (e.g., a viscoelastic adhesive material, a viscoplastic adhesive material, or an elastic adhesive material) and also undergoes a structural, phase, or chemical change when irradiated with light (e.g., that absorbs the incident light, thereby generating gas that expands, forming a blister within the film 704). The tape 700 can act as a substrate for receiving discrete components 110 transferred in a laser-assisted transfer process, as described above. When a discrete component 110 is transferred onto the tape 700, the film 704 receives and retains the discrete component 110, e.g., as described above for adhesive die catching films. In some examples, a protective film (not shown) is disposed on the film 704 and is removed prior to component transfer.

The tape 700 with attached discrete components then can be used as a source tape in a subsequent laser-assisted transfer process to transfer the discrete components 110 to another substrate. For instance, an optical system can be used to illuminate a rear surface 710 of the flexible polymer substrate 702. The flexible polymer substrate 702 is transparent to the wavelength of the incident light such that the light passes through the flexible polymer substrate and is incident on an area of the film 704. The film 704 undergoes a chemical, phase, or structural change in at least a portion of the irradiated area, causing a discrete component 110 to be released from the tape 700. For instance, the film 704 is formed of or includes a material that is configured to absorb the incident light, resulting in generation of gas and formation of a blister in the material.

Figure 8A:
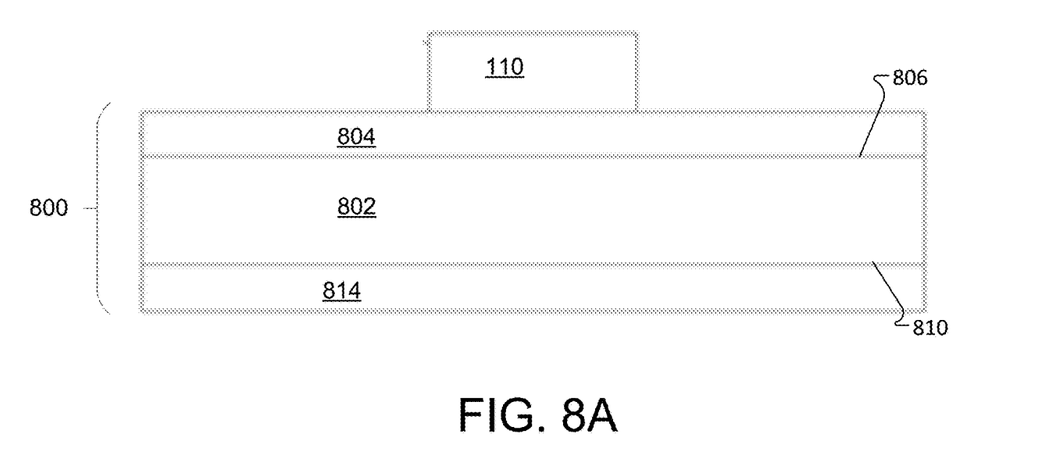
FIGS. 8A and 8B are diagrams of a tape for receiving transferred discrete components.

FIG. 8A shows an example of a tape 800. The tape 800 includes a flexible polymer substrate 802 with an adhesive die catching film 804 disposed on a front surface 806 of the substrate 802. A dynamic release structure 814 is disposed on a rear surface 810 of the substrate 802. The tape 800 can act as a substrate for receiving discrete components 110 transferred in a laser-assisted transfer process, as described above. The adhesive die catching film 804 is a viscoelastic or viscoplastic adhesive material or an elastic adhesive material. When a discrete component 110 is transferred onto the tape 800, the adhesive die catching film 804 receives and retains the discrete component 110. In some examples, a protective film (not shown) is disposed on the adhesive die catching film and is removed prior to component transfer.

Figure 8B:
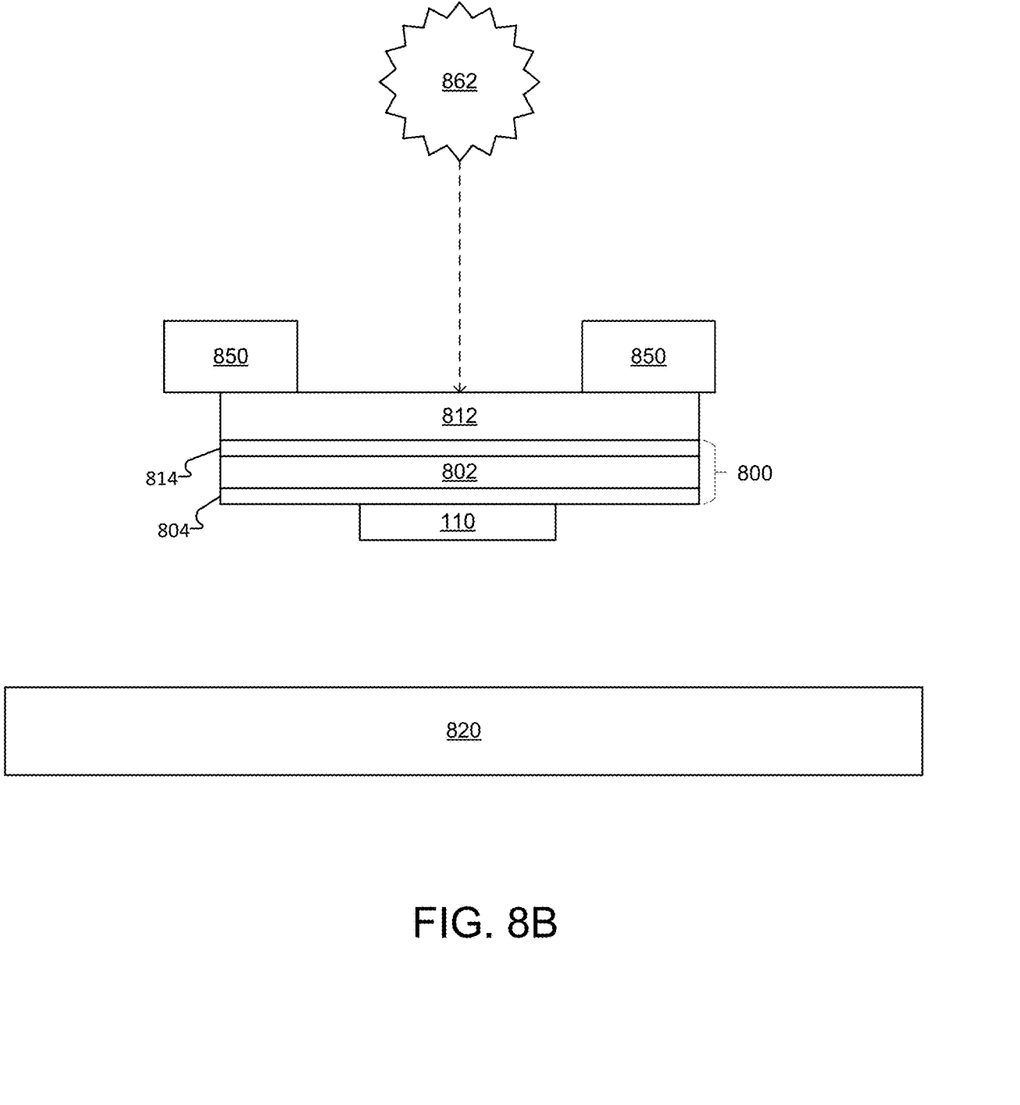

Referring to FIG. 8B, the tape 800 with attached discrete components can be used as a source tape in a subsequent laser-assisted transfer process to transfer the discrete components 110 to a target substrate 820. The tape 800 is bonded to a rigid support 812, with the dynamic release structure 814 adhered to the support 812. The rigid support 812 is held in a discrete component support fixture 850 and a back side of the support 812 is irradiated with light from a light source 862, as discussed above for FIG. 1. The support 812 and the flexible polymer substrate 802 are both transparent to the wavelength of the incident light such that the light passes through the support 812 and the polymer substrate 802 and is incident on an area of the dynamic release structure 814. The irradiation causes a change in the dynamic release structure 814 that releases the discrete component 110 from the tape 800. The discrete component 110 is propelled away from the support 812 and lands on the target substrate 820.

Die catching tapes such as those described here can have advantages over other die catching substrates, such as rigid substrates having a die catching fluid or gel disposed thereon. For instance, an adhesive die catching film can be applied to another substrate, such as a rigid substrate, quickly, easily, and inexpensively, e.g., by removing a rear protective film and applying the adhesive die catching film to the rigid substrate. An adhesive die catching film can also be removed from another substrate, such as a rigid substrate, quickly, easily, and inexpensively, e.g., by peeling the film off of the substrate.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

What is claimed:

1. A tape for receiving a discrete component transferred by a laser-assisted transfer process, the tape comprising:
   a flexible polymer substrate;
   a dynamic release structure disposed on the flexible polymer substrate; and
   an adhesive die catching film disposed on the dynamic release structure, wherein the adhesive die catching film receives the discrete component via the laser-assisted transfer process,
   wherein the tape is used during a subsequent laser-assisted transfer process to transfer the discrete component to another substrate.

2. The tape of claim 1, in which the adhesive die catching film comprises one or more of a viscoelastic adhesive material, a viscoplastic adhesive material, or an elastic adhesive material.

3. The tape of claim 1, in which the dynamic release structure undergoes a structural, phase, or chemical change responsive to irradiation of the dynamic release structure.

4. The tape of claim 1, in which the dynamic release structure forms a blister responsive to absorbing incident radiation.

5. A tape for receiving a discrete component transferred by a laser-assisted transfer process, the tape comprising:
   a flexible polymer substrate;
   an adhesive die catching film disposed on a first surface of the flexible polymer substrate, wherein the adhesive die catching film receives the discrete component via the laser-assisted transfer process; and
   a dynamic release structure disposed on a second surface of the flexible polymer substrate,
   wherein the tape is used during a subsequent laser-assisted transfer process to transfer the discrete component to another substrate.

6. The tape of claim 5, in which the adhesive die catching film comprises one or more of a viscoelastic adhesive material, a viscoplastic adhesive material, or an elastic adhesive material.

7. The tape of claim 5, in which the dynamic release structure undergoes a structural, phase, or chemical change responsive to irradiation of the dynamic release structure.

8. The tape of claim 5, in which the dynamic release structure forms a blister responsive to absorbing incident radiation.

9. A tape for receiving a discrete component transferred by a laser-assisted transfer process, the tape comprising:
   a flexible polymer substrate; and
   a film disposed on the flexible polymer substrate, in which the film comprises one or more of a viscoelastic adhesive material, a viscoplastic adhesive material, or an elastic adhesive material, wherein the film receives the discrete component via the laser-assisted transfer process, and in which the film undergoes a structural, phase, or chemical change responsive to irradiation of the film during a subsequent laser-assisted transfer process to transfer the discrete component to another substrate.

10. The tape of claim 9, in which the film is forms a blister responsive to absorption of incident radiation.

11. A tape for receiving a discrete component transferred by a laser-assisted transfer process, the tape comprising:
   a flexible polymer substrate;
   an adhesive die catching film disposed on the flexible polymer substrate, in which the adhesive die catching film comprises one or more of a viscoelastic adhesive material, a viscoplastic adhesive material, or an elastic adhesive material, wherein the adhesive die catching film receives the discrete component via the laser-assisted transfer process; and a protective film disposed on the adhesive die catching film, wherein the adhesive die catching film undergoes a structural, phase, or chemical change responsive to irradiation during a subsequent laser-assisted transfer process to transfer the discrete component to another substrate.

12. The tape of claim 11, in which the adhesive die catching film comprises a pressure-sensitive adhesive.

13. The tape of claim 11, in which the adhesive die catching film comprises a Bingham fluid.

14. The tape of claim 11, in which the adhesive die catching film comprises a crosslinking promoter.

15. The tape of claim 14, in which the crosslinking promoter comprises a photosensitive polymer.

16. The tape of claim 14, in which the crosslinking promoter comprises a chemical catalyst.

17. The tape of claim 11, in which the adhesive die catching film is disposed on a front surface of the flexible polymer substrate, and in which a rear surface of the flexible polymer substrate comprises an adhesive material.

18. The tape of claim 17, comprising a rigid substrate, in which the flexible polymer substrate is adhered to the rigid substrate by the adhesive material.

19. The tape of claim 11, in which the tape comprises a dynamic release structure disposed on the flexible polymer substrate, and in which the adhesive die catching film is disposed on the dynamic release structure.

20. The tape of claim 11, in which the flexible polymer substrate is removable from the adhesive die catching film.

21. The tape of claim 11, in which the protective film is removable from the adhesive die catching film.

22. The tape of claim 11 wherein the adhesive die catching film includes a die catching material which is reused for multiple laser-assisted transfer processes.

23. The tape of claim 11 wherein the adhesive die catching film includes a die catching material, the die catching material having an adhesive property that enables the adhesive die catching film to receive the discrete component transferred onto the tape by the laser-assisted transfer process, to retain the discrete component substantially in the same position once the discrete component is received, and to cause the discrete component to lie flat on the tape, the die catching material prevents shifting, bouncing, and tombstoning of the discrete component.

24. The tape of claim 11 wherein the adhesive die catching film includes a die catching material, the die catching material including polydimethylsiloxane (PDMS).

* * * * *